(12) United States Patent
Sugawara et al.

(10) Patent No.: US 6,359,292 B1
(45) Date of Patent: Mar. 19, 2002

(54) SEMICONDUCTOR LIGHT EMITTING ELEMENT

(75) Inventors: Hideto Sugawara, Nakahara-Ku; Koichi Nitta, Yokohama, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/261,667

(22) Filed: Mar. 3, 1999

(30) Foreign Application Priority Data

Mar. 11, 1998 (JP) .......................................... 10-059378

(51) Int. Cl.$^7$ .............................................. H01L 33/00
(52) U.S. Cl. .......................... 257/103; 257/96; 257/201; 257/613
(58) Field of Search .................... 257/103, 96, 101, 257/102, 22, 613, 615, 201

(56) References Cited

U.S. PATENT DOCUMENTS 5,578,839 A   11/1996  Nakamura et al. ........... 257/201
5,917,196 A  * 6/1999  Teraguchi .................... 257/103

FOREIGN PATENT DOCUMENTS

| JP | 7-312445 | 11/1995 |
| JP | 8-078726 | 3/1996 |
| JP | 9-023026 | 1/1997 |

OTHER PUBLICATIONS

Yoshimoto, et al. "Photoluminescence of InGaN films grown at High Temperature by Metalorganic Vapor Phase Epitaxy," Appl. Phys. Lett. 59 (18), Oct. 28, 1991, pp. 2251–2253.

Matsuoka, Takashi. "Calculation of Unstable Mixing Region in Wurtzite $In_{(1-x-y)}Ga_xAl_yN$," Appl. Phys. Lett. 71 (1), Jul. 7, 1997, pp. 105–106.

* cited by examiner

*Primary Examiner*—Mark V. Prenty
(74) *Attorney, Agent, or Firm*—Hogan & Hartson, L.L.P.

(57) ABSTRACT

In a light emitting element using nitride compound semiconductors, an active layer made of a mixed crystal containing In additionally contains at least Al or B as a component of the mixed crystal to improve the thermal resistance of the crystal and the reliability of the element characteristics. Thus, the semiconductor light emitting element has a sufficient lifetime and permits the emission wavelength to be freely selected from a wider wavelength range including blue, green and orange.

13 Claims, 4 Drawing Sheets

SEMICONDUCTOR LIGHT EMITTING ELEMENT

BACKGROUND OF THE INVENTION

This invention relates to a semiconductor light emitting element, especially one such as LED (light emitting diode) or semiconductor laser diode, for example, made of nitride compound semiconductors, and having an active layer containing indium (In).

Nitride compound semiconductors ensure efficient luminous recombination because of their optical transition being of a direct transition type, and their development is under progress toward the use as materials of semiconductor lasers, high-luminance LEDs and other high-efficiency light emitting elements.

In the present application, the term "nitride compound semiconductor" pertains to any III-V compound semiconductor expressed by $B_zAl_yIn_xGa_{(1-x-y-z)}N$ ($0 \leq x \leq 1$, $0 \leq y \leq 1$, $0 \leq z \leq 1$), and group V elements are construed to also involve mixed crystals containing phosphorus (P) and/or arsenic (As) in addition to N.

Indium gallium nitride ($In_xGa_{1-x}N$), one of mixed crystals of nitride compound semiconductors, can be changed in band gap energy from 3.42 eV of GaN to 2 eV of InN by adjusting the mole fraction X of In, and can be used as an active layer of a visible light emitting element.

So-called "double-heterostructure" is often used in semiconductor lasers, light emitting diodes or other semiconductor light emitting elements. This is a structure in which an active layer (or emission layer) having an energy band gap corresponding to a predetermined emission wavelength is sandwiched by cladding layers with a larger band gap. Usable as the material of the emission layer of the semiconductor light emitting element having a double-heterostructure is indium gallium nitride ($In_xGa_{1-x}N$) which is one of mixed crystals of nitride compound semiconductors. Indium gallium nitride can be changed in band gap energy from 3.42 eV of GaN to 2 eV of InN by adjusting the mole fraction X of In, and can be used as the active layer of a visible light emitting element.

However, existing semiconductor light emitting elements using indium gallium nitride as their emission layers involved the problem that the lifetime may be insufficient.

FIG. 8 is a graph showing a result of a reliability test of an existing semiconductor light emitting element in changes with time of optical outputs of a blue light emitting diode using as its active layer a mixed crystal, i.e., indium gallium nitride ($In_xGa_{1-x}N$) in which the mole fraction X of indium is 20%. The emission wavelength is about 450 nm, the operative current of the light emitting diode is 20 mA, and its operative temperature is the room temperature. It is known from FIG. 7 the optical output of the light emitting diode suddenly begins deterioration approximately after 1000 hours, and deteriorates to approximately a half in 10000 hours.

This decrease in optical output causes problems in various fields of its application. For example, in the case where a blue light emitting element using indium gallium nitride as its active layer is employed in a traffic signal, a decrease in emission luminance will seriously degrades the visibility. In the case where it is employed as a light emitting element for reading and writing data in an optical disk system, it will become difficult to write data, and read errors will increase. When it is employed in a multi-color display or full-color display, its deterioration with time will appear as irregular colors.

SUMMARY OF THE INVENTION

It is therefore an object of the invention to provide a semiconductor light emitting element having a sufficient life time and selective in emission wavelength from a wide ranges of wavelengths including blue, green and orange as well.

The Inventors found through his own researches that various characteristics can be improved in a light emitting element using a nitride compound semiconductor containing In (indium) as its active layer by adding at least one of Al (aluminum) and B (boron). More particularly, the thermal resistance of the crystal can be improved, and the reliability of the element characteristics can be improved remarkably.

The above-mentioned feature of the invention is very unique. When In is added to GaN, the band gap energy becomes smaller than 3.42 eV which corresponds to the band gap energy of GaN. Naturally, the emission wavelength becomes longer than 364 nm which corresponds to the wavelength of GaN. In contrast, when Al or B is added to GaN, the band gap energy becomes larger than 3.42 eV, and the emission wavelength becomes shorter than 364 nm.

Therefore, only In or Al or B has been added to GaN depending upon the required emission wavelength heretofore. Only indium has been conventionally added to GaN to form the emission layer for the emission wavelength range longer than 364 nm.

In contrast to this, the Inventors found that a light emitting element can be remarkably improved in reliability by adding both In and Al or B while keeping the emission wavelength longer than 364 nm.

InGaN conventionally used as an active layer inevitably caused deterioration of element characteristics because of insufficient thermal crystalline stability. The invention is characterized in improving the reliability of the element by incorporating a Al-based and/or B-based mixed crystals to InGaN to achieve a relatively high thermal stability. When an AlInGaN, BInGaN or BAlInGaN semiconductor is used as the active layer, light in the range from the visible band to ultraviolet wavelengths can be obtained by adjusting the energy gap relying on concentrations of In and Al or B.

Structural features of the semiconductor light emitting element according to the invention lie in: an active layer being made of a nitride compound semiconductor containing at least one of Al and B, In, Ga and N and having an energy gap as small as 3.42 eV; and emission being effected by band-to-band recombination.

According to the invention, characteristics of the semiconductor light emitting element can be stabilized by adding Al (aluminum) and/or B (boron) to InGaN forming the active layer. That is, the semiconductor light emitting element according to the invention does not degrades in optical output even after 10000 hours, and its lifetime is remarkably improved as compared with an existing semiconductor element for emitting blue light in the same wavelength range. In this manner, according to the invention, the life time of the semiconductor light emitting element is improved remarkably by increasing the mole fraction of indium in a conventionally used ternary mixed crystal and adding aluminum or boron to indium gallium nitride thereto so as to adjust the band gap.

The prominent features of the invention are against the existing common view, and have been obtained by Inventors' own researches.

Moreover, according to the invention, the difference in lattice constant can be reduced to improve the reliability of the light emitting element furthermore by using GaN as the material of layers adjacent to the active layer. That is, when cladding layers, for example, adjacent to the active layer are made of GaN, the difference of its lattice constant from the active layer having a band gap corresponding to one from blue to green can be reduced to further improve the lifetime of the light emitting element.

Emission characteristics can be improved also by doping silicon to the light emitting layer. That is, the practical concentration of silicon used in the invention ranges from $1\times10^{17} cm^{-3}$ to $1\times10^{21} cm^{-3}$, and the light emitting element with a silicon concentration in this range exhibited no deterioration. Thus, it has been confirmed that the light emitting element according to the invention be highly reliable even when the luminous intensity is increased by doping silicon in this range of concentration.

As summarized above, the invention successfully realizes a semiconductor light emitting element with high reliability and high performance, and its industrial merit is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below are some embodiments of the invention with reference to the drawings.

Figure 1:
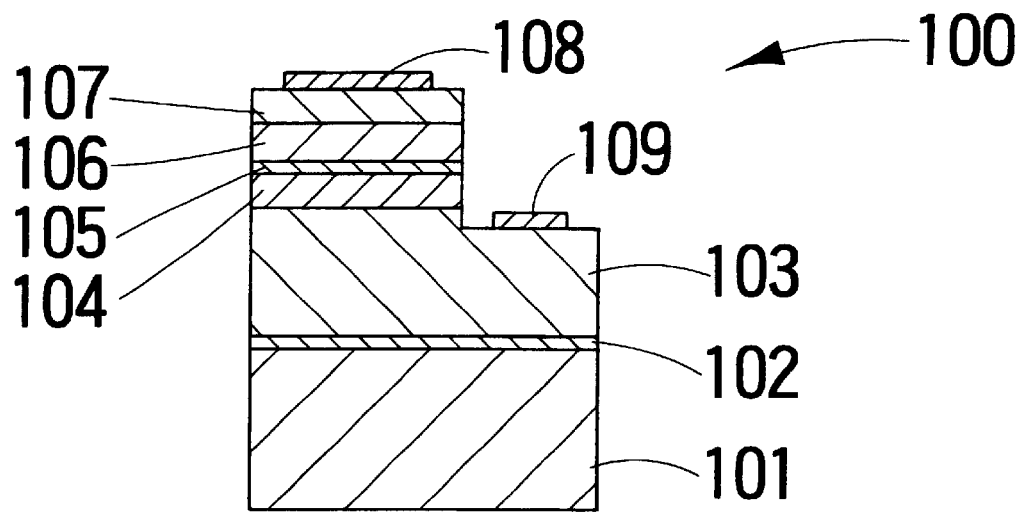
FIG. 1 is a schematic cross-sectional view of a multi-layered structure of a semiconductor light emitting element 100 according to the first embodiment of the invention.

FIG. 1 is a schematic cross-sectional view of the multi-layered structure of the semiconductor light emitting element 100 taken as the first embodiment of the invention. The semiconductor element 100 shown here is a surface-emitting type LED. Reference numeral 101 denotes a sapphire substrate, on which a GaN buffer layer 102, n-type GaN contact layer 103, n-type GaN cladding layer 104, n-type AlInGaN active layer 105, p-type GaN cladding layer 106 and p-type GaN contact layer 107 are stacked sequentially by crystalline growth. Metal organic chemical vapor deposition, for example, may be used for the crystalline growth. Electrodes for injection of a current are made as a p-side electrode 108 and an n-side electrode 109 on exposed locations of the n-type GaN contact layer 103 by etching.

The current injected through the electrodes 108 and 109 induces emission of light by recombination of carriers in the active layer 105. Light generated in the active layer 105 is released to the exterior through the substrate 101 or electrode 108.

The invention uses an AlInGaN-based quaternary mixed crystal containing Al to form the active layer 105. The band gap of the active layer 105 is smaller than 3.42 eV. That is, the band gap of the active layer 105 in the present invention is smaller than the band gap 3.42 eV of the GaN.

For making an active layer smaller in band gap than GaN, existing techniques simply added indium (In) alone to GaN.

The invention, however, intentionally adds Al to make the AlInGaN quaternary mixed crystal for making the active layer with a smaller band gap than GaN. In mixed crystals of this type, in general, an increase in mole fraction of indium decreases the band gap whereas an increase in mole fraction of aluminum increases the band gap. For example, in case of a mixed crystal, indium gallium nitride ($In_xGa_{1-x}N$) with the mole fraction x of indium being approximately 45% causes emission of blue light of the wavelength 520 nm, approximately, by band-to-band emission. When Al is added this by approximately 10% in mole fraction, the band gap increases, and blue light of the wavelength 450 nm, approximately, can be obtained by band-to-band emission. Thus, the invention remarkably improves the reliability of the light emitting element as explained later in greater detail by employing a quaternary mixed crystal additionally containing aluminum (Al) relative to indium gallium nitride used in the existing technique.

The cladding layers 104 and 106 adjacent over and under the active layer 105 are made of GaN. Lattice constants of cladding layers made of GaN do not differ so much from that of the active layer having a band gap corresponding to one from blue to green, and this contributes to a further improvement of the lifetime of the light emitting element. That is, AlInGaN-based quaternary mixed crystals for wavelength bands from blue to visible light have larger lattice constants than that of GaN. In contrast, AlGaN often used heretofore as the material of cladding layers has a smaller lattice constant than that of GaN. Therefore, when AlGaN is used as the material of cladding layers adjacent to the active layer like the existing technique, their difference in lattice constant increases. The invention, however, decreases the difference in lattice constant from the AlInGaN quaternary mixed crystal by using GaN as the material of the cladding layers adjacent to the active layer, and more improves the reliability.

Figure 2:
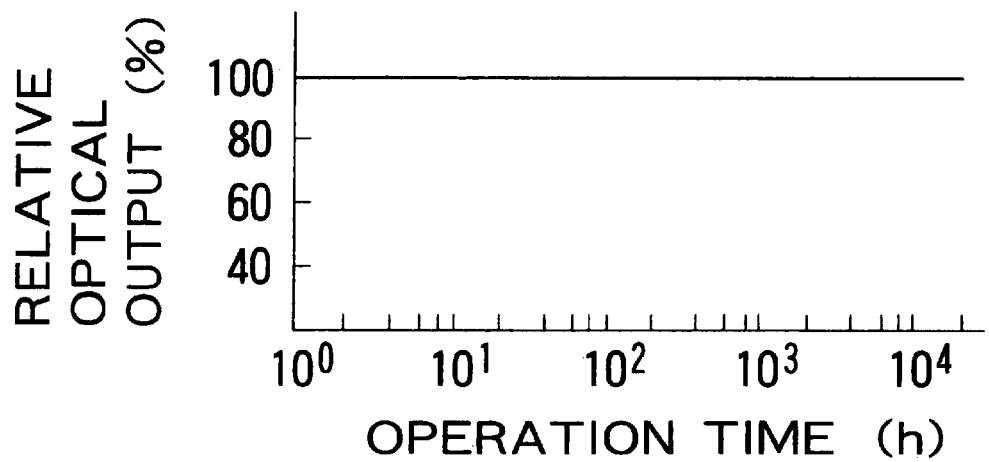
FIG. 2 is a graph showing a result of a lifetime test on the semiconductor light emitting element 100 according to the invention.
Figure 8:
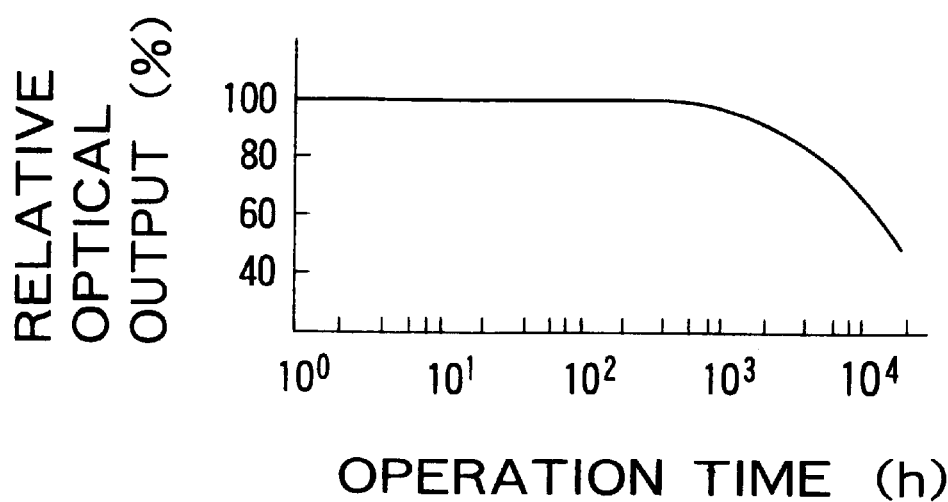
FIG. 8 is a graph showing a result of a reliability test of an existing semiconductor light emitting element.

FIG. 2 is a graph showing a result of a lifetime test on the semiconductor light emitting element according to the invention. The test was conducted on a light emitting diode using as its active layer the AlInGaN quaternary mixed crystal with the above-mentioned composition ratio by continuously operating it at the room temperature under the operative current 20 mA. As shown in FIG. 2, the semiconductor light emitting element according to the invention does not deteriorate in optical output even after 10000 hours. Remarkable improvement in lifetime is noted in comparison with the existing semiconductor light emitting element (FIG. 8) for emitting blue light in the same wavelength band. That is, according to the invention, the life time of the semiconductor light emitting element is remarkably improved by increasing the mole fraction of indium in the conventionally used indium gallium nitride ternary mixed crystal and adding aluminum thereto to thereby adjust the band gap.

These remarkable effects of the invention are against from the conventional common view. That is, it was conventionally believed that an increase in mole fraction of indium in indium gallium nitride should decrease the stability of the crystal and deteriorates the reliability of the light emitting element for the reasons shown below.

The first may be a decrease in growth temperature. That is, indium gallium nitride ternary mixed crystals may be considered as combinations of GaN and InN. As to GaN, it usually needs a growth temperature of 1000° C. or higher to ensure an acceptable crystalline quality. In contrast, for InN containing In having a relatively high vapor pressure, the growth temperature must be lower than that of GaN. Therefore, in order to increase the mole fraction x of indium in indium gallium nitride ($In_xGa_{1-x}N$), the growth temperature must be lowered than GaN. This is explained, for example, in Appl. Phys. Lett. 59, 2251(1991). That is, it was believed that the crystal growth temperature should be lowered than that of GaN in order to increase the mole fraction of indium in indium gallium nitride; this would result in degradation of the crystallographic property; and the lifetime of a light emitting element using the crystal as its active layer would be short.

On indium gallium nitride, it is known that the interactive parameter between binary compounds, InN and GaN, is large and that a miscibility-gap region exists. This is explained, for example, in Appl. Phys. Lett. 71, 105(1997). That is, it was believed that, if the mole fraction of indium were increased, the crystal would get near the miscibility-gap and become unstable; and the lifetime of a light emitting element using the crystal as its active layer would be short.

As explained above, the conventional belief was: indium gallium nitride needs lowering the crystal growth temperature so much as the mole fraction is increased; the crystal grown under such a low temperature is liable to be thermally unstable; since the composition approaches the miscibility-gap region, it is difficult to obtain a complete crystal; and an element using a mixed crystal containing a high mole fraction of indium as its emission layer exhibits unstable characteristics and its reliability in a long-term operation should be low.

However, the Inventors made various researches concerning to the present invention and has found that, against the conventional common view, the lifetime of a light emitting element is improved when the mole fraction of indium in indium gallium nitride is increases by a certain degree.

Figure 3:
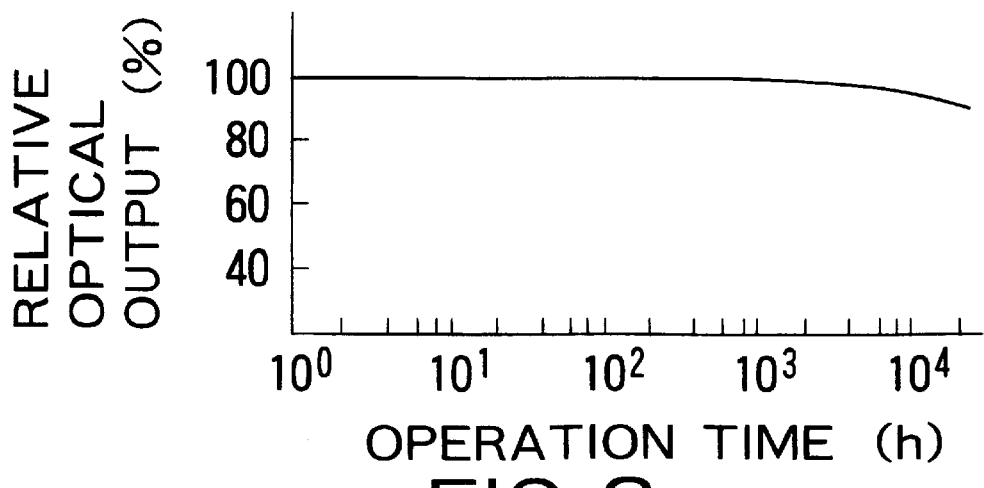
FIG. 3 is a graph of a lifetime test on a semiconductor light emitting element obtained through the Inventors' own researches.

FIG. 3 is a graph of a lifetime test on a semiconductor light emitting element obtained through the Inventors' own researches. That is, data shown in FIG. 3 is a result of a lifetime test on a light emitting diode employing as its active layer indium gallium nitride in which the mole fraction of indium is 45%. Comparing with the data of FIG. 7 in which the mole fraction of indium is 20%, the lifetime has been improved irrespectively of the mole fraction of indium being increased.

Although it was conventionally believed that the reliability would degrade as the mole fraction of indium increased in indium gallium nitride, it has been found that the reliability is actually recovered against the conventional belief when the mole fraction of indium increases to a certain degree. This result is inconsistent with the conventional common view, and it is considered to support a part of the effects of the present invention. That is, according to the invention, by increasing the mole fraction of indium in indium gallium nitride and adding aluminum, the band gap is adjusted. As a result, the lifetime of the light emitting element is improved.

For example, the active layer 105 of the semiconductor light emitting element according to the invention shown in FIG. 1 is made of an InAlGaN quaternary mixed crystal obtained by adding a small amount of Al to an existing InGaN crystal (mole fraction of indium being 45%) which emits green light, and its emission wavelength is held in a wavelength band shorter than green, relying upon the mole fraction of Al. That is, since the energy gap of AlN is larger than those of GaN and InN, the emission wavelength of a crystal containing Al gets shorter as the mole fraction of Al in the mixed crystal increases. In the construction of the embodiment shown here, Al is mixed to green-luminous InGaN as a component of the crystal to thereby obtain the element emitting blue light of 450 nm by band-to-band emission. It is assumed that the reliability has been improved as shown in FIG. 3 by increasing the mole fraction of indium higher than the conventional technique.

On the other hand, as shown in FIG. 2, the light emitting element according to the invention has been improved in reliability more than the light emitting element of FIG. 3. Although no clear reason has been located, it is assumed that the improvement be a result of increased stability of the crystal by addition of aluminum.

The Inventors next made researches on effects of doping of silicon (Si) to the light emitting element according to the invention.

Figure 4:
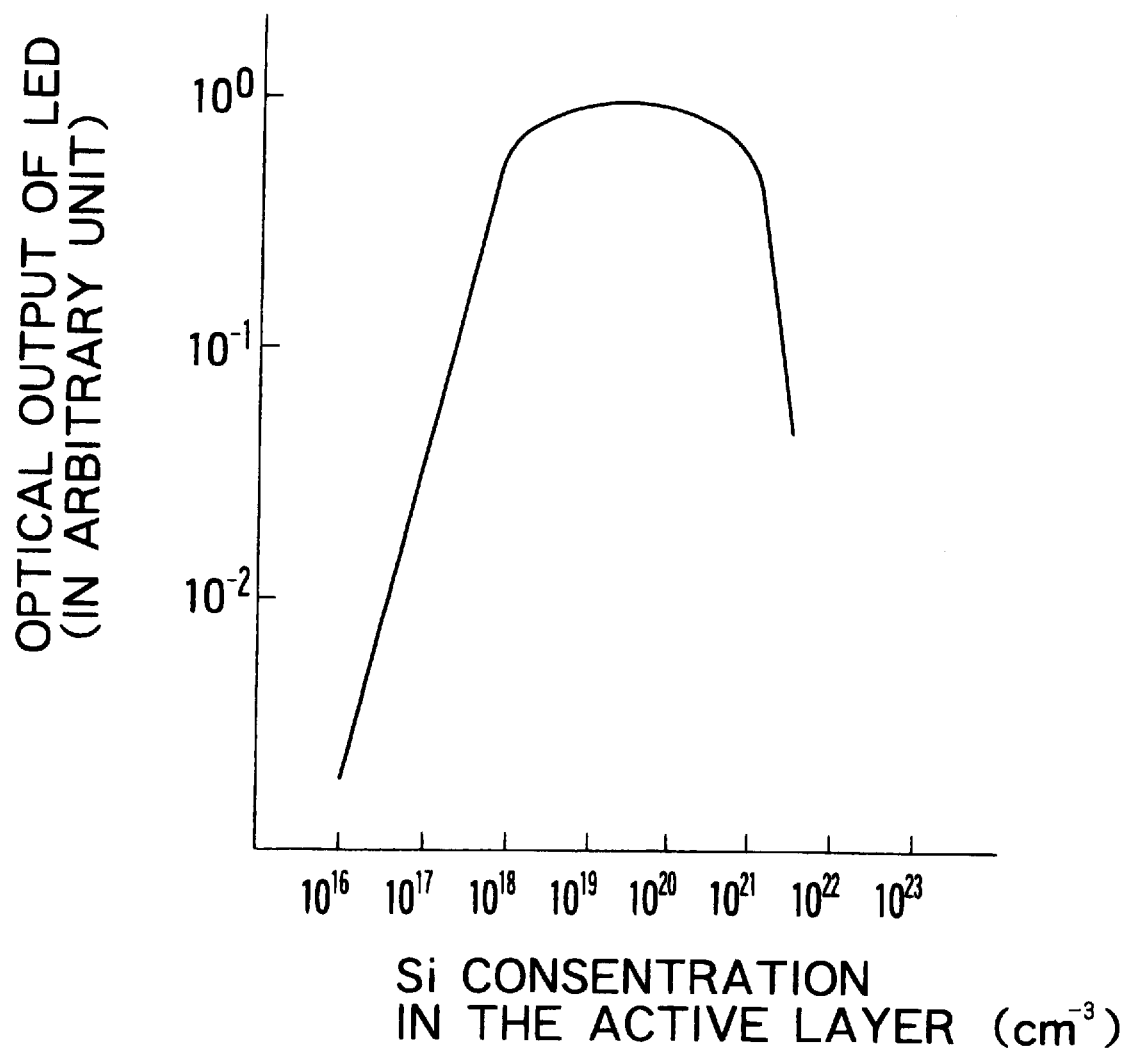
FIG. 4 is a graph showing a relationship between the Si concentration in the active layer of the light emitting element according to the invention and its luminous intensity.

FIG. 4 is a graph showing relationship between the Si concentration and the luminous intensity of the light emitting element according to the invention. As shown here, the luminous intensity of a light emitting diode changes with Si concentration. The luminous intensity increases suddenly near $1\times10^{17}cm^{-3}$, of the Si concentration, then becomes maximum near $1\times10^{18}cm^{-3}$ to $1\times10^{20}cm^{-3}$, and suddenly decreases with higher Si concentrations. This tendency was held unchanged even when changing the crystallographic mixture ratio of the active layer. When Si was doped by $1\times10^{19}cm^{-3}$ to the AlInGaN active layer 105 in the layered structure shown in FIG. 1, the luminous intensity was 3 mW under the emission wavelength being 450 nm and the operative current being 20 mA. This result is the same as the luminous intensity of the conventional light emitting diode which exhibits the same emission wavelength and does not contain aluminum in the active layer. That is, this evidences that, also in the element added with aluminum in the active layer according to the invention, the luminous intensity can be increased by doping silicon in the same manner as the conventional element. It is known from FIG. 4 that practical silicon concentrations range from $1\times10^{17}cm^{-3}$ to $1\times10^{21}cm^{-3}$. In any silicon concentration in this range, the light emitting element exhibited no deterioration in reliability. That is, in the light emitting element according to the invention, even when the luminous intensity is increased by doping silicon in this range of concentration, very high reliability as shown in FIG. 2 was obtained.

Next explained is a specific example in which the crystallographic composition of the active layer 105 is changed, with reference to FIG. 1.

First used as the material of the active layer was an AlInGaN mixed crystal obtained by adding about 8% of Al to originally yellow-luminous InGaN (the mole fraction of In being 77%). As a result, the emission wavelength was shortened, and emission of green light of approximately 520 nm was obtained. Simultaneously, the lifetime of the light emitting element was improved similarly as the former case, and no deterioration was observed even after continuous operation of 10000 hours.

Next used as the material of the active layer was an AlInGaN mixed crystal obtained by adding about 5% of Al to orally red-luminous InGaN (the mole fraction of In being 96%). As a result, the emission wavelength was shortened, and emission of yellow light of approximately 590 nm was obtained. Simultaneously, the lifetime of the light emitting element was improved similarly to the former case.

Next used as the material of the active layer 105 was an AlInGaN mixed crystal obtained by adding about 1% of Al to originally red-luminous InGaN (the mole fraction of In being 96%). As a result, emission of orange light of approximately 620 nm was obtained. Simultaneously, the lifetime of the light emitting element was improved similarly to the former case.

As explained above with specific examples, the emission wavelength can be changed largely and a highly reliable light emitting element can be realized simultaneously by adjusting the composition of the crystal of the active layer.

Figure 5:
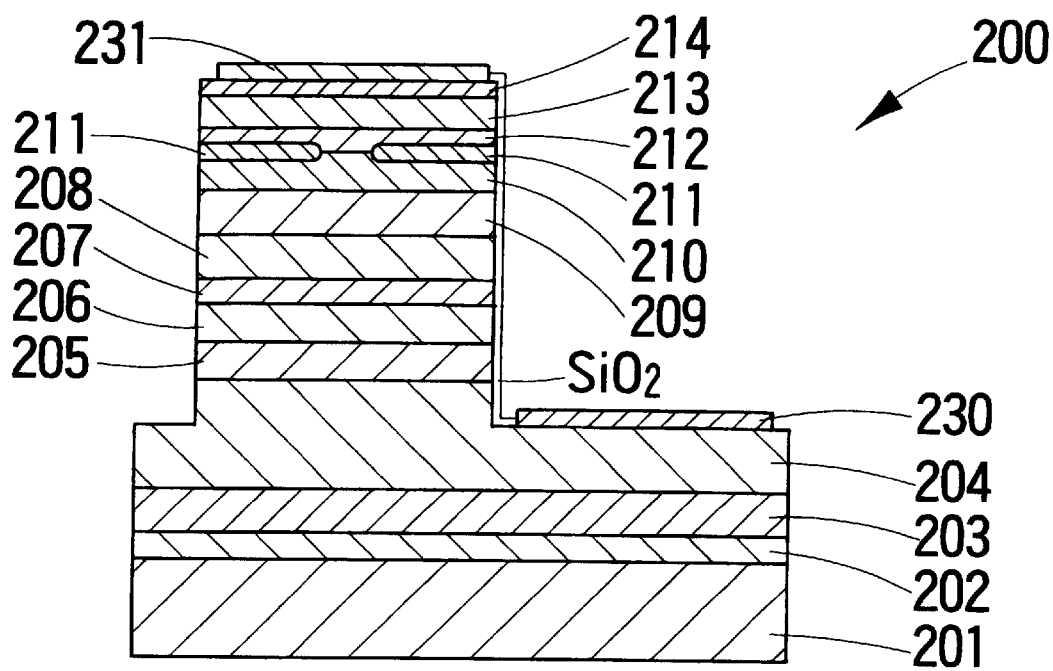
FIG. 5 is a schematic cross-sectional view of a multi-layered structure of a semiconductor light emitting element 200 according to the second embodiment of the invention.

FIG. 5 is a schematic cross-sectional view of the multi-layered structure of another semiconductor light emitting element according to the invention. The semiconductor light emitting element 200 is an edge-emitting type semiconductor laser in which a laser structure of nitride compound semiconductors is formed on a sapphire substrate 201 having an a-plane as its major surface. More specifically, sequentially stacked on the substrate 201 are a GaN buffer layer 202, undoped GaN layer 203, n-type GaN contact layer 204, n-type AlGaN cladding layer 205, n-type GaN guiding layer 206, active layer 207, p-type GaN guiding layer 208, p-type AlGaN cladding layer 209, p-type GaN layer 210, current blocking layer 211, p-type GaN layer 212, p-type GaN layer 213, and p-type GaN contact layer 214. The element has formed an n-side electrode 230 on the n-type contact layer 204 and a p-side electrode 231 on the p-type contact layer 214.

The active layer 207 has a multiquantum well (MQW) structure having five cycles of 5 nm thick AlInGaN barrier layers with the mole fraction of In being 15% and 3 nm thick AlInGaN well layers with the mole fraction of In being 45%.

According to the invention, by using AlInGaN quaternary mixed crystals as the barrier layers and the well layers of the multiquantum well structure forming the active layer 207, remarkable improvement in reliability as explained with FIG. 2 can be realized.

Additionally, according to the invention, by using GaN as the material of the guiding layers 206, 208 adjacent to the active layer 207, the difference in lattice constant from the AlInGaN active layer can be reduced, and the reliability of the semiconductor laser element can be improved more.

Next explained is another modified version of the present invention.

Figure 6:
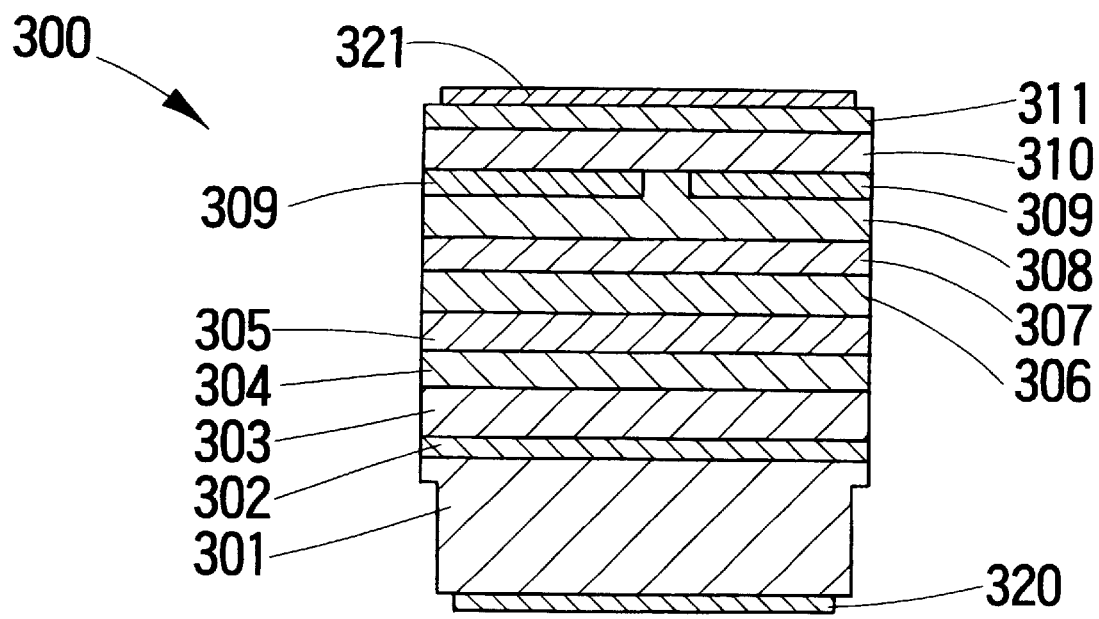
FIG. 6 is a schematic diagram showing a cross-sectional structure of a semiconductor light emitting element 300 according to the third embodiment of the invention.

FIG. 6 is a schematic diagram showing a cross-sectional structure of a third semiconductor light emitting element 300 according to the invention. The light emitting element 300 shown here is a semiconductor laser having an n-type GaN substrate 301. Alternatively, a 4H type SiC substrate having the carbon plane on its (0001) surface on which a laser structure is formed. Numeral 306 denotes the active layer which is the major subject of the present invention, and it has a multiquantum well structure made of AlInGaN.

The semiconductor laser 300 includes a GaN buffer layer 302, n-type GaN layer 303, n-type AlGaN cladding layer 304, n-type GaN guiding layer 305, multiquantum well active layer 306, p-type GaN guiding layer 307, p-type AlGaN cladding layer 308, i-type AlGaN current blocking layer 309, p-type GaN layer 310 and p-type InGaN contact layer 311 which are stacked on the substrate 301. The laser 300 has further formed an n-side electrode 320 on the bottom surface of the GaN or SiC substrate 301 and a p-side electrode 321 on the p-type contact layer 311.

The active layer 306 has a multiquantum well (MQW) structure including three cycles of 5 nm thick AlInGaN barrier layers with the mole fraction of In being 10% and 3 nm thick AlInGaN well layers with the mole fraction of In being 40%.

In this manner, by using AlInGaN quaternary mixed crystals as the barrier layers and the well layers of the multi-quantum well structure forming the active layer 306, remarkable improvement in reliability as explained with reference to FIG. 2 can be realized.

Additionally, by using GaN as the material of the guiding layers 305, 307 adjacent to the active layer 306, the difference in lattice constant from the AlInGaN active layer 306 can be reduced, and the reliability of the semiconductor laser element can be improved more.

Moreover, since the light emitting element 300 uses electrically conductive GaN or SiC as its substrate 301, the electrode 320 can be formed on its bottom surface. As a result, as compared with the element having formed the electrode on the sapphire substrate, the element structure and its manufacturing process can be simplified, and the device size can be reduced.

Next explained is a third modified version of the present invention.

Figure 7:
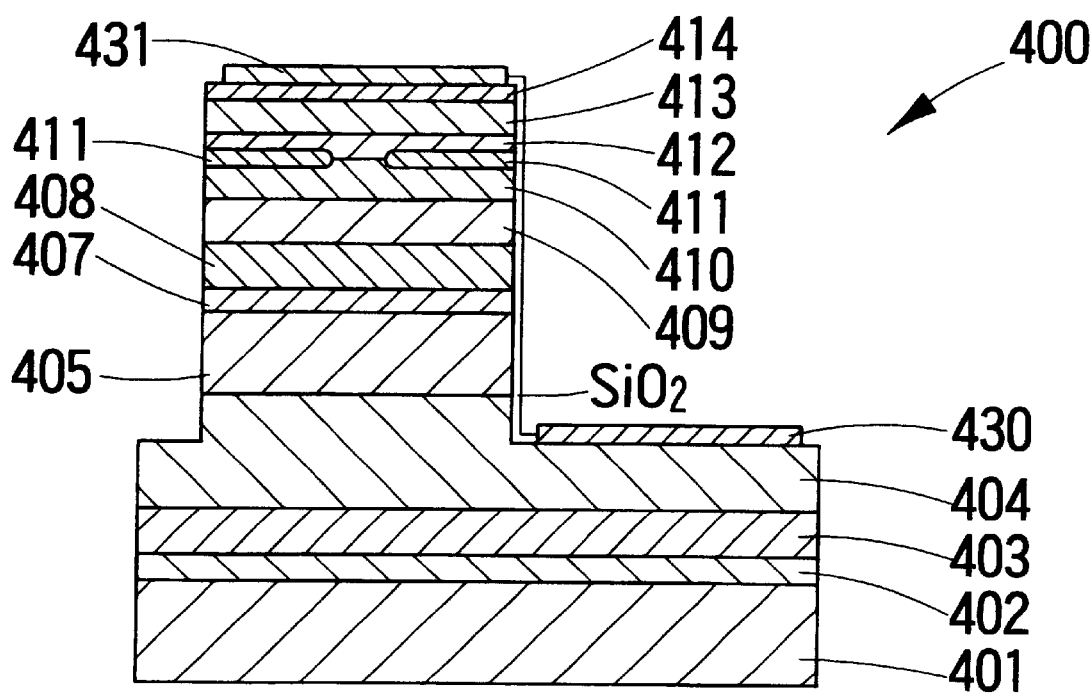
FIG. 7 is a schematic cross-sectional view of the multi-layered structure of a semiconductor light emitting element 400 according to the forth embodiment of the invention.

FIG. 7 is a schematic cross-sectional view of the multi-layered structure of a semiconductor light emitting element according to the invention. The semiconductor light emitting element 400 is an edge-emitting type semiconductor laser in which a laser structure of nitride compound semiconductors is formed on a sapphire substrate 401 having an a-plane as its major surface. More specifically, sequentially stacked on the substrate 401 are a GaN buffer layer 402, undoped GaN layer 403, n-type GaN contact layer 404, n-type GaN cladding layer 405, active layer 407, p-type AlGaN overflow-preventing layer 408, p-type GaN cladding layer 409, p-type GaN layer 410, current blocking layer 411, p-type GaN layer 412, p-type GaN layer 413, and p-type GaN contact layer 414. The element has formed an n-side electrode 430 on the n-type contact layer 404 and a p-side electrode 431 on the p-type contact layer 414.

The active layer 407 has a multiquantum well (MQW) structure having five cycles of 5 nm thick AlInGaN barrier layers with the mole fraction of In being 15% and 3 nm thick AlInGaN well layers with the mole fraction of In being 45%.

According to the invention, by using AlInGaN quaternary mixed crystals as the barrier layers and the well layers of the multiquantum well structure forming the active layer 407, remarkable improvement in reliability as explained with FIG. 2 can be realized.

Additionally, according to the invention, by placing p-type AlGaN overflow-preventing layer 408 between the active layer 407 and the cladding layer 409, the overflow of the carrier injected from the active layer 407 can be prevented. This is especially advantageous for the high power lasers of a high-injection type. The lattice constant of the AlGaN layer 408 may differ from the lattice constant of the active layer 407. However, by making the thickness of the AlGaN layer 408 thin enough, the GaN cladding layer 405, the active layer 407, the AlGaN layer 408 and the GaN cladding layer 409 may be in the quasi-lattice matched state. A high power laser or a high power LED having a excellent reliability can be realized by employing this structure.

Although the invention has been explained above by way of specific embodiments, the invention is not limited to these embodiments.

For example, the embodiments add Al to InGaN to shorten the emission wavelength, the same effect is obtained by using boron (B). Alternatively, a BAlInGaN semiconductor added with both Al and B may be used as the active layer.

The use of a BInGaN quaternary mixed crystal added with B instead of Al promises various effects like the case using an AlInGaN mixed crystal, and is more advantageous in terms of the purity of the crystal. That is, Al has a strong bonding force with oxygen, and results in incorporating oxygen into the crystal as an impurity in an AlInGaN mixed crystal. The incorporated oxygen may make a non-radiative center and decrease the luminous efficiency of the light emitting element.

In contrast, in case of BInGaN mixed crystals, crystals with less incorporation of oxygen and a larger luminous intensity are obtained, and more desirable light emitting elements can be made.

On the other hand, BAlInGaN quinary mixed crystals containing both Al and B are advantageous in providing more freedom in selecting components and selecting the design of the element. When arsenic (As) or phosphorus (P) is added as a group V element of a mixed crystal forming the active layer, the emission wavelength can be changed to a longer wavelength.

Although the specific examples shown above use sapphire or SiC as the substrate, any other substrate may be used as long as it is appropriate for growing nitride compound semiconductors. For example, insulating substrates, such as spinel, MgO, ScAlMgO$_4$, LaSrGaO$_4$ and (LaSr)(AlTa)O$_3$, and conductive substrates, such as GaN, ZnO and Si, can be used similarly. Especially, GaN and ZnO are advantageous because AlInGaN quaternary crystals readily get in lattice matching with them.

Furthermore, the invention is similarly effective also when it is applied to edge-emitting type LEDs or surface-emitting lasers other than above-mentioned surface-emitting type LEDs or edge-emitting type lasers.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. 10-59378 filed on Mar. 3, 1998 including specification, claims, drawings and summary is incorporated herein by reference in its entirety.

What is claimed is:

1. A semiconductor light emitting element comprising:
   an active layer made of a nitride compound semiconductor which contains In (indium), Ga (gallium), N (nitrogen), Al (aluminum) and B (boron);
   a composition ratio of said In being equal to or greater than 45% and having an energy gap smaller than 3.42 eV, said active layer emitting light by band-to-band recombination;
   a first cladding layer made of a first conduction type nitride compound semiconductor having an energy gap larger than that of said active layer; and
   a second cladding layer made of a second conduction type nitride compound semiconductor having an energy gap larger than that of said active layer,
   said active layer being stacked on said first cladding layer, and said second cladding layer being stacked on said active layer;
   wherein said light emitted by said active layer has a wavelength longer than 364 nm.

2. The semiconductor light emitting element according to claim 1 wherein said active layer fiter contains silicon by a concentration in the range from $1 \times 10^{17}$ cm$^{-3}$ to $1 \times 10^{21}$ cm$^{-3}$.

3. The semiconductor light emitting element according to claim 1 wherein said active layer includes a multiple quantum well structure having alternatively stacked barrier layers and well layers, said barrier layers having a first energy gap smaller than that of GaN and said well layers having a second energy gap smaller than said first energy gap.

4. The semiconductor light emitting element according to claim 1 further comprising:
   a first guiding layer made of a nitride compound semiconductor of a first conduction type having an energy gap larger than that of said active layer and smaller than that of said first cladding layer; and
   a second guiding layer made of a nitride compound semiconductor of a second conduction type having an energy gap larger than that of said active layer and smaller than that of said second cladding layer,
   said first guiding layer being stacked between said first cladding layer and said active layer, and said second guiding layer being stacked between said active layer and said second cladding layer.

5. The semiconductor light emitting element according to claim 4 wherein said first cladding layer is made of AlGaN, said first guiding layer is made of GaN, said second guiding layer is made of GaN and said second cladding layer is made of AlGaN.

6. A semiconductor light emitting element comprising:
   a substrate;
   a first cladding layer formed on top surface of said substrate, said first cladding layer being made of a n-type nitride compound semiconductor;
   an active layer formed on said first cladding layer;
   a second cladding layer formed on said active layer, said second cladding layer being made of a p-type nitride compound semiconductor said active layer being made of a nitride compound semiconductor which contains In (indium), Ga (gallium), N (nitrogen), Al (aluminum) and B (boron), a composition ratio of said In being equal to or greater than 45% and having an energy gap smaller than that of GaN, said active layer emitting light by band-to-band recombination;
   wherein said active layer emits light emitted by said active layer has a wavelength longer than 364 nm.

7. The semiconductor light emitting element according to claim 6 wherein said active layer further contains silicon by a concentration in the range from $1 \times 10^{17}$ cm$^{-3}$ to $1 \times 10^{21}$ cm$^{-3}$.

8. The semiconductor light emitting element according to claim 6 wherein said active layer includes a multiple quantum well structure having alternatively stacked barrier layers and well layers, said barrier layers having a first energy gap smaller than that of GaN and said well layers having a second energy gap smaller than said first energy gap.

9. The semiconductor light emitting element according to claim 6 wherein said substrate is made of sapphire.

10. The semiconductor light emitting element according to claim 6 further comprising:

a p-side electrode formed on said second cladding layer; and a n-side electrode formed on a bottom surface of said substrate.

11. The semiconductor light emitting element according to claim 10 wherein said substrate is made of n-type GaN.

12. The semiconductor light emitting element according to claim 10 wherein said substrate is made of SiC.

13. The semiconductor light emitting element according to claim 6 further comprising an overflow-preventing layer formed between said active layer and said second cladding layer, said overflow-preventing layer being made of AlGaN.

* * * * *